United States Patent
Nair et al.

(10) Patent No.: US 10,483,250 B2
(45) Date of Patent: Nov. 19, 2019

(54) THREE-DIMENSIONAL SMALL FORM FACTOR SYSTEM IN PACKAGE ARCHITECTURE

(71) Applicant: Intel Corporation, Santa Clara, CA (US)

(72) Inventors: Vijay K. Nair, Mesa, AZ (US); Adel A. Elsherbini, Chandler, AZ (US); Lakshman Krishnamurthy, Portland, OR (US); Johanna M. Swan, Scottsdale, AZ (US); Alexander Essaian, Santa Clara, CA (US); Torrey W. Frank, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/765,992

(22) PCT Filed: Nov. 4, 2015

(86) PCT No.: PCT/US2015/059088
§ 371 (c)(1),
(2) Date: Apr. 4, 2018

(87) PCT Pub. No.: WO2017/078709
PCT Pub. Date: May 11, 2017

(65) Prior Publication Data
US 2018/0286840 A1    Oct. 4, 2018

(51) Int. Cl.
*H01L 25/16* (2006.01)
*H01L 23/48* (2006.01)
(Continued)

(52) U.S. Cl.
CPC ............ *H01L 25/162* (2013.01); *H01L 23/48* (2013.01); *H01L 23/5385* (2013.01);
(Continued)

(58) Field of Classification Search
CPC . H01L 25/162; H01L 23/49816; H01L 25/50; H01L 23/5385; H01L 23/5389;
(Continued)

(56) References Cited

U.S. PATENT DOCUMENTS 8,866,301 B2 * 10/2014 Lin .................... H01L 21/4846
257/686
9,881,894 B2 * 1/2018 Pendse .............. H01L 21/76898
(Continued)

FOREIGN PATENT DOCUMENTS

WO    2017/078709 A1 *  5/2017  ............. H01L 23/48

OTHER PUBLICATIONS

International Preliminary Report on Patentability for PCT/US2015/059088 dated May 17, 2018, 12 pgs.
(Continued)

*Primary Examiner* — Alexander O Williams
(74) *Attorney, Agent, or Firm* — Schwabe, Williamson & Wyatt P.C.

(57) ABSTRACT

Embodiments are generally directed to three-dimensional small form factor system in package architecture. An embodiment of an apparatus includes a first package having a first side and an opposite second side, the first package including a plurality of embedded electronic components and one or more embedded via bars, each via bar including a plurality of through vias; and a second package having a first side and an opposite second side, the second package including a plurality of embedded electronic components, wherein a first side of the first package and a second side of second package are coupled together by a plurality of connections, including at least a first connection connecting the second package to a first component of the first package and a second connection connecting the second package to a first via bar of the one or more via bars.

25 Claims, 21 Drawing Sheets

Assemble Top Package and Bottom Package With
Thermal Compression Bonding

(51) Int. Cl.
  *H01L 23/00*   (2006.01)
  *H01L 25/10*   (2006.01)
  *H01L 23/538*  (2006.01)
  *H01L 25/00*   (2006.01)
  *H01L 21/56*   (2006.01)
  *H01L 23/498*  (2006.01)

(52) U.S. Cl.
  CPC .............. *H01L 24/19* (2013.01); *H01L 24/20* (2013.01); *H01L 24/24* (2013.01); *H01L 24/73* (2013.01); *H01L 24/96* (2013.01); *H01L 25/105* (2013.01); *H01L 25/50* (2013.01); *H01L 21/568* (2013.01); *H01L 23/49816* (2013.01); *H01L 23/5389* (2013.01); *H01L 2223/6677* (2013.01); *H01L 2224/04105* (2013.01); *H01L 2224/12105* (2013.01); *H01L 2224/16227* (2013.01); *H01L 2224/24137* (2013.01); *H01L 2224/24146* (2013.01); *H01L 2224/24155* (2013.01); *H01L 2224/24195* (2013.01); *H01L 2224/73209* (2013.01); *H01L 2224/73267* (2013.01); *H01L 2225/1035* (2013.01); *H01L 2225/1058* (2013.01); *H01L 2924/15321* (2013.01); *H01L 2924/15331* (2013.01); *H01L 2924/18162* (2013.01); *H01L 2924/19105* (2013.01)

(58) Field of Classification Search
  CPC ........... H01L 24/24; H01L 2224/73209; H01L 2224/24137; H01L 2224/24155; H01L 2224/24195; H01L 2224/24146; H01L 23/48; H01L 24/19; H01L 24/20; H01L 24/96; H01L 25/105

USPC ........ 257/777, 686, 685, 723, 778, 737, 738
  See application file for complete search history.

(56) References Cited

U.S. PATENT DOCUMENTS

| | | |
|---|---|---|
| 2010/0102428 A1 | 4/2010 | Lee et al. |
| 2010/0219523 A1 | 9/2010 | Chow et al. |
| 2013/0241025 A1* | 9/2013 | Pagani ................. H01L 21/768 257/499 |
| 2014/0035892 A1 | 2/2014 | Shenoy et al. |
| 2014/0103488 A1 | 4/2014 | Chen et al. |
| 2015/0228580 A1 | 8/2015 | Chen et al. |
| 2015/0348940 A1* | 12/2015 | Woychik ............ H01L 25/0657 257/774 |
| 2016/0086930 A1* | 3/2016 | Koey .................... H01L 25/50 257/773 |
| 2017/0077072 A1* | 3/2017 | Yap ...................... H01L 25/105 |
| 2017/0179078 A1* | 6/2017 | Jung ................... H01L 25/0652 |
| 2017/0194281 A1* | 7/2017 | DeLaCruz .......... H01L 23/3121 |
| 2017/0365587 A1* | 12/2017 | Hung ................. H01L 23/5386 |
| 2018/0226334 A1* | 8/2018 | Sankman ................ H01L 24/00 |
| 2018/0269183 A1* | 9/2018 | Kim .................... H01L 25/0657 |
| 2018/0286833 A1* | 10/2018 | Khalaf ............... H01L 25/0652 |
| 2018/0295717 A1* | 10/2018 | Yu ........................ H05K 1/0271 |

OTHER PUBLICATIONS

International Search Report and Written Opinion for International Patent Application No. PCT/US2015/059088 dated Jul. 28, 2016, 15 pgs.

* cited by examiner

Pick and Place Components and Via Bars

Release Carrier and Flip Molded Wafer

First Package
800

Application of Dielectric Layer
and
Application and Structuring of RDL and Pads

First Package 800

Application of
Second Set of Dielectric Layer and RDL

Thinning of Mold Compound
Exposure of BGA and Via Bar Pads

First Package
800

Application of Solder Balls
Optional Opossum Die Attach

Contact Opening in Solder Resist Layer

THREE-DIMENSIONAL SMALL FORM FACTOR SYSTEM IN PACKAGE ARCHITECTURE

CROSS-REFERENCE TO RELATED APPLICATION

This patent application is a U.S. National Phase Application under 35 U.S.C. § 371 of International Application No. PCT/US2015/059088, filed Nov. 4, 2015, entitled "THREE-DIMENSIONAL SMALL FORM FACTOR SYSTEM IN PACKAGE ARCHITECTURE," which designated the United States of America, the entire disclosure of which is hereby incorporated by reference in its entirety and for all purposes.

TECHNICAL FIELD

Embodiments described herein generally relate to the field of electronic devices and, more particularly, to a three-dimensional small form factor system in package architecture.

BACKGROUND

Mobile devices, such as smart phones or wearable devices, are used for increasingly sophisticated operations. Further, electronics are being installed in less traditional devices utilizing, for example, Internet of Things (IoT) networking, which provides great promise in provide new functionality, monitoring, and control.

Such devices require a high level of integration in a very small footprint because the physical space allowed for a circuit board is very limited. In addition, these devices commonly require integration of heterogeneous electronic components of varying sizes to provide needed functionality, thus complicating the efficient design of the device electronics.

However, the size of wireless system SiPs (Systems in Package) that consist of ICs and large number of associated passive components (such as capacitors, inductors, and resistors) and that are fabricated using traditional package technology (such as board level assembly and package stacking using an interposer approach) may be too large to be competitive in the relevant market segments for new electronic devices, which will require very compact and efficient fabrication.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
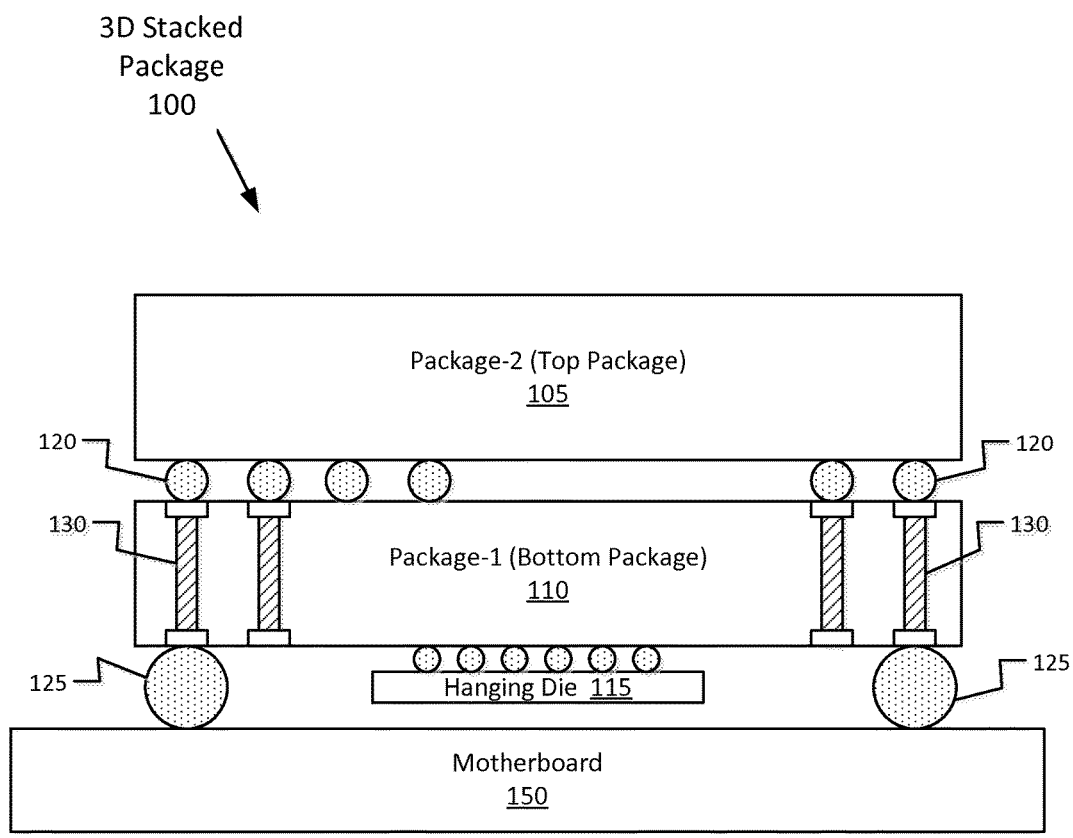
FIG. 1 is an illustration of a three-dimensional stacked system in package according to an embodiment.

Embodiments described herein are generally directed to three-dimensional small form factor system in package architecture.

As used herein:

"Mobile device" or "mobile electronic device" means a smartphone, smartwatch, tablet computer, notebook or laptop computer, handheld computer, mobile Internet device, wearable technology, or other mobile apparatus that includes processing ability and communication ability.

"Wearable electronics" or "wearable" means an electronic device that is integrated at least in part into an item that may be worn by a user. Wearable electronics may include electronic devices that operate independently as well as electronic devices that operate in conjunction with a second electronic device, such as a mobile device.

"Electronic device" includes any apparatus, device, or system having an electronic system to provide one or more functions, the functions including, but not limited to, mobile devices and wearable devices.

In some embodiments, an electronic device includes a three-dimensional (3D) stacked System in Package (SiP) to integrate many disparate electronic components in a very small form factor. Integrated circuits (ICs), packages, and passive components are integrated and assembled in tight spaces for wearables and other highly integrated heterogeneous systems for mobile and other applications. However, even with highly integrated systems, the electronics footprint could become too large to be incorporated in wearable devices, including, but not limited to, smartwatches and health monitoring devices, including wristwatch, wristband, and other health monitoring devices.

Because all the necessary components of a SiP may not be produced in house (i.e., produced by a different manufacturer than the manufacturer of the SiP), commercially available components are often procured from an outside source. As the number of packaged components, integrated circuits an active components, and passive components increase and the footprint available for package assembly decreases, new architectures are required. In some embodiments, an innovative architecture and method to embed disparate components of varying dimensions is provided. In some embodiments, a new process for fabricating 3D stacked system-in-packages to produce extremely small size SiPs suitable ultra-small form factor mobile devices is proposed.

In some embodiments, an architecture and process includes embedding disparate components of varying dimensions and configuration using, for example, e-WLB (embedded Wafer Level Ball Grid Array (BGA)) and e-PLB (embedded Panel Level BGA) substrate technology. In some embodiments, a process includes assembling a 3D stacked system in packages to produce extremely small size SiPs suitable for wearable devices and other ultra-small form factor mobile devices.

In some embodiments, a 3D stacked SiP architecture includes:

(1) A first package (which may also be referred to as the bottom package) in which at least one component has a same height as a through via bar in the package, wherein the at least one component is in WLCSP (Wafer Level Chip Scale Package) or Flip Chip format.

As used herein, a via bar includes any grouping of two or more vias. While via bars are illustrated herein in a particular form, including a certain number of vias arranged in a line, embodiments are not limited to any particular number of vias, any particular arrangement of a group of vias, or any particular placement of the group of vias in a package.

(2) At least one silicon SoC (System on Chip) die attached to the bottom side of the first package and directly coupled to at least one component in the first package.

(3) A Ball Grid Array (BGA) attached to the bottom side of the first package to assemble the first package to a motherboard.

(4) Silicon SoC die thickness and the BGA ball heights chosen such that the SoC die does not come in contact with the motherboard to which the first package is attached.

(5) A second package (which may also be referred to as the top package) attached to the top side of the first package, the second package being directly connected to at least one component in the first package.

(6) At least one through via bar (including any group of two or more vias) contained in the first package that connects to circuits in the second package.

(7) Any components of the 3D system in package that have a larger height than the tallest component in the first package are embedded in the second package.

(8) Two or more radio frequency (RF) components are grouped together and placed adjacent to each other in the first (bottom) package.

FIG. 1 is an illustration of a three-dimensional stacked package according to an embodiment. In some embodiments, a three-dimensional stacked system in package 100 includes a first package 110 (which may also be referred to as the bottom package) coupled with a second package 105 (the top package). In some embodiments, the stacked system in package 100 further includes a hanging die 115 (which may also be referred to a opossum device coupled with the first package 110. In some embodiments, the first package 110 is coupled with a motherboard 150 by a ball grid array (BGA) 125.

In some embodiments, the first package 110 includes one or more via bars (or one or more of any groups of multiple through vias) 130. In some embodiments, each of the first package 110 and second package 105 includes multiple embedded electronic components, wherein the components may include one or more packaged components, one or more active components or integrated circuits, and one or more passive components. In some embodiments, the partition and stacking can be reconfigured to optimize to the form factor requirement for a specific product implementation. The components of the first package 110 and the second package 105 are described in greater detail with regard to FIGS. 2 and 3, and the stacked system in package 100 is described in greater detail with regard to FIG. 4.

Figure 2:
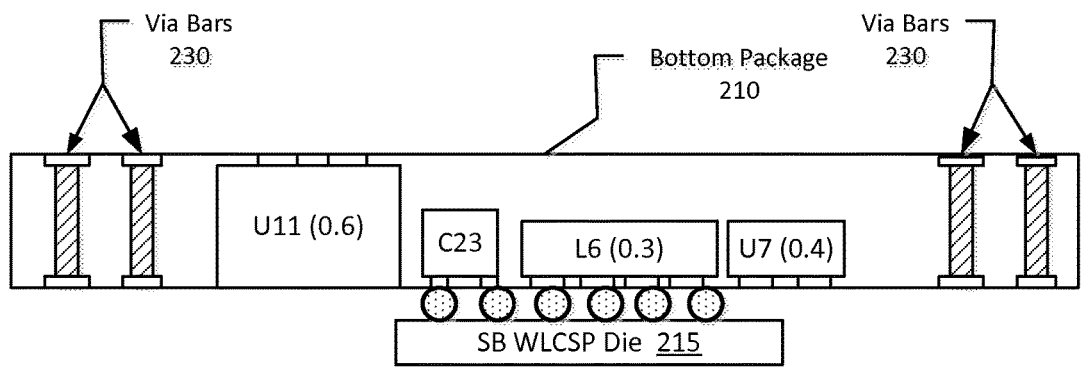
FIG. 2 is an illustration of a first package of a three-dimensional stacked system in package according to an embodiment.

FIG. 2 is an illustration of a first package of a three-dimensional stacked system in package according to an embodiment. In some embodiments, a first package (or bottom package) 210 of a 3D stacked system in package includes one or more embedded via bars (each containing a plurality of through vias) 230 (which may, in one possible example, include four via bars to provide one at each corner, with each via bar including 5 vias), and multiple embedded electronic components, which may include one or more packaged components (component U11 in this example), one or more active devices or integrated circuits (components L6 and U7 in this example), and one or more passive components (such as capacitor C23 in this example).

In some embodiments, a tallest component (largest in a Z-direction, where X and Y-directions are lateral directions along the package) of the bottom package 210 (U11 with height of 0.6 mm (which may be, for example, a crystal oscillator) and the one or more via bar 230 are chosen to have the same height. All other components in the first package 210 have heights that are less than or equal to U11.

In some embodiments, a package such as an SoC die (SB WLCSP) 215 is optionally attached to contact pads on the bottom side of the first package 210 in a hanging die fashion. In the illustrated example, the hanging die component 215, being in WLCSP format, is placed with contact pads facing upward to facilitate direct connection to the first package 210. Further details regarding connections for the bottom package 210 are illustrated in FIGS. 8A-8M.

In some embodiments, one or more components are RF (radio frequency) components to operate at radio frequency. In the example illustrated in FIG. 2, two components L6 (Bluetooth LE, for example) and U7 (BLUN component, for example) operate at RF frequencies and, to maximize the output power efficiency, these components are placed adjacent to each other and as close as possible to the hanging die 215 to maximize the power transmission to an antenna.

Figure 3:
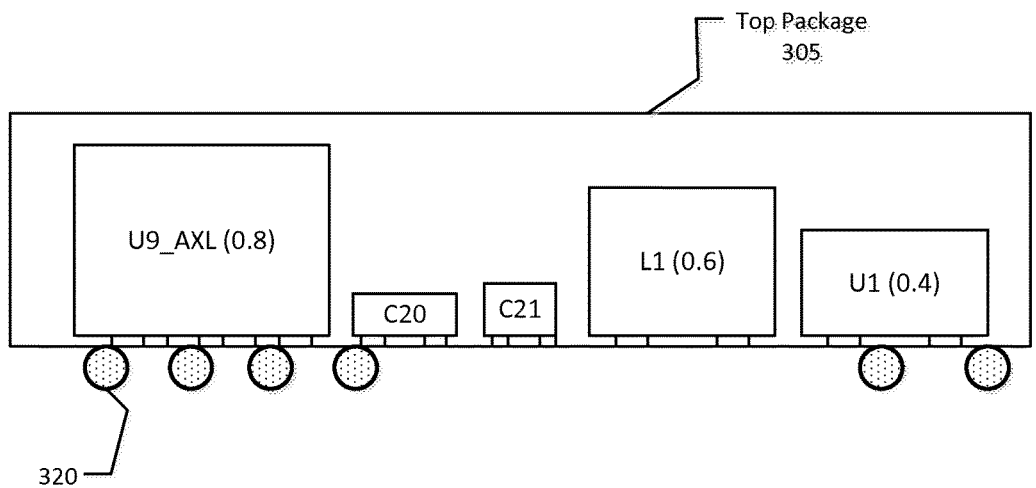
FIG. 3 is an illustration of a second package of a three-dimensional stacked system in according to an embodiment.

FIG. 3 is an illustration of a second package of a three-dimensional stacked system in package according to an embodiment. In some embodiments, a second package (or top package) 305 of a 3D stacked system in package is fabricated for attachment to a top surface of the first/bottom package 210, as illustrated in FIG. 2. In some embodiments, the second/top package 305 contains multiple embedded electronic components, which may include one or more packaged components, one or more active components or integrated circuits (U9 and U1 in this example), and one or more passive components (capacitors C20 and C21 and inductor L1 in this example).

Figure 4:
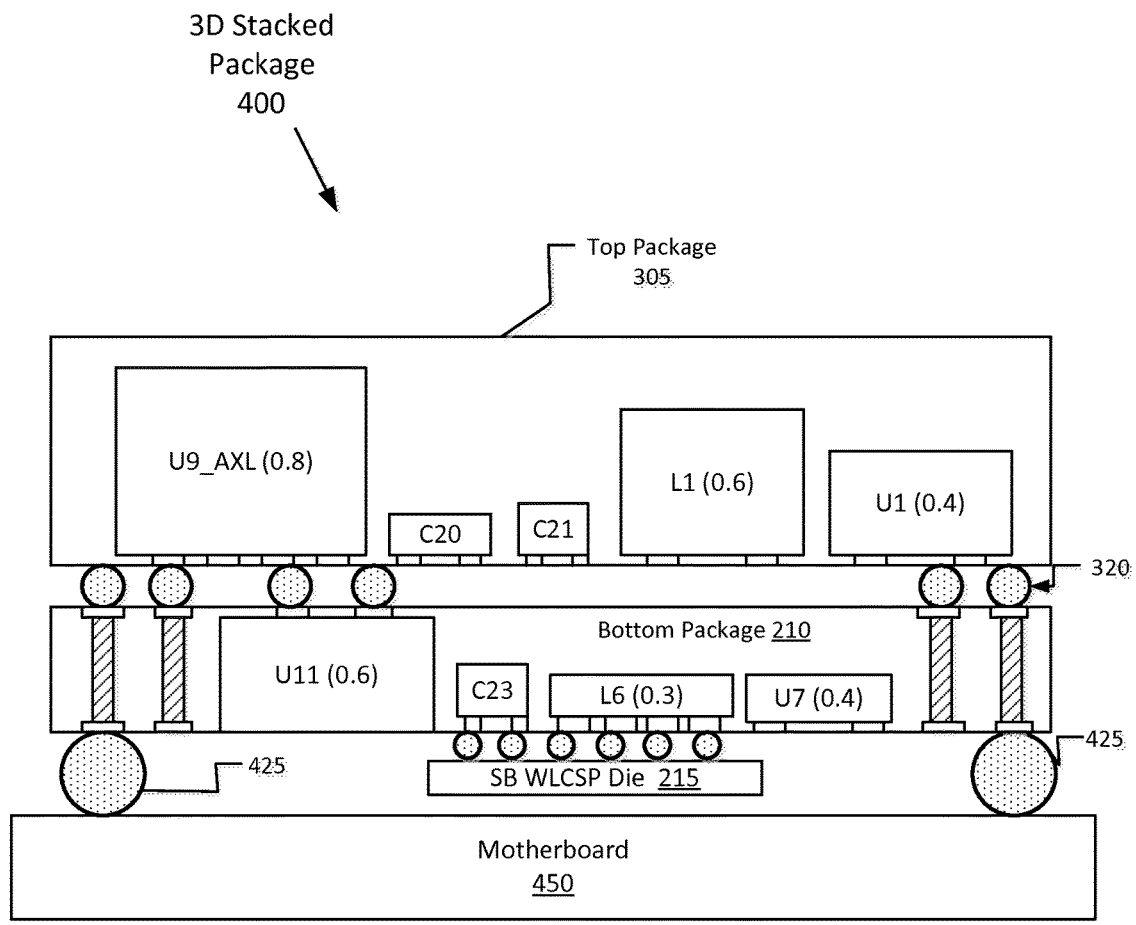
FIG. 4 is an illustration of a three-dimensional stacked system in package according to an embodiment.

In some embodiments, a plurality of connections, such as solder ball connections 320, are to be coupled with the top package 305 for purposes of coupling the top package 305 to the bottom package 210 of FIG. 2, with the coupled packages being illustrated in FIG. 4. Further details regarding connections for the top package 305 are illustrated in FIGS. 8A-8M.

In some embodiments, a tallest component or components of the stacked system in package will be contained in the top package 305. In the example illustrated in FIG. 3, a tallest element of the stacked system in package is U9, where U9 is a package having a height in the z-axis that is larger than a height of U11 of the bottom package 210, where U9 thus is to be placed in the top package 305. In a particular example, U9 is a sealed accelerometer (AXL) that may be utilized in numerous mobile and wearable devices.

FIG. 4 is an illustration of a three-dimensional stacked system in package according to an embodiment. In some embodiments, the bottom package 210 (as illustrated in FIG. 2) with optional coupled hanging/opossum die (a WLCSP die) 215 is coupled with the top package 305 (as illustrated in FIG. 3) to form a 3D stacked package 400.

In some embodiments, a plurality of connections, such as solder ball connections 320, couple the top package 305 to the bottom package 210. In some embodiments, the top package 305 is electrically coupled with at least one component (U11 in this example) of the bottom die 210 and to via bars 230 of the bottom die 210, such as coupling of the packages using a solder ball attachment process.

In some embodiments, also coupled with the bottom package 210 are multiple balls of a ball grid array (BGA) 425 to provide coupling with a motherboard 450 (such as motherboard 150 illustrated in FIG. 1), where the diameters of the BGA elements 425 are large enough to prevent contact of the hanging die 215 with the coupled motherboard 450, i.e., the diameters are greater than a height of the hanging die 215. In some embodiments, the BGA balls are attached along a periphery of the first package 210 on its bottom side, this being the same side to which the hanging die 215 is attached. In a particular example in which a hanging die 215 is coupled with the bottom package 210, the BGA height and hanging die thickness are chosen to provide about 70 to 100 um clearance between the hanging die 215 and the motherboard 450 when the first/bottom die 210 is assembled onto the motherboard 450. However, embodiments are not limited to a particular clearance distance between the hanging die 215 and the motherboard 450. In some embodiments, the BGA balls provide an electrical connection between the vias 230 of the bottom package 210 and the motherboard 450.

Figure 5:
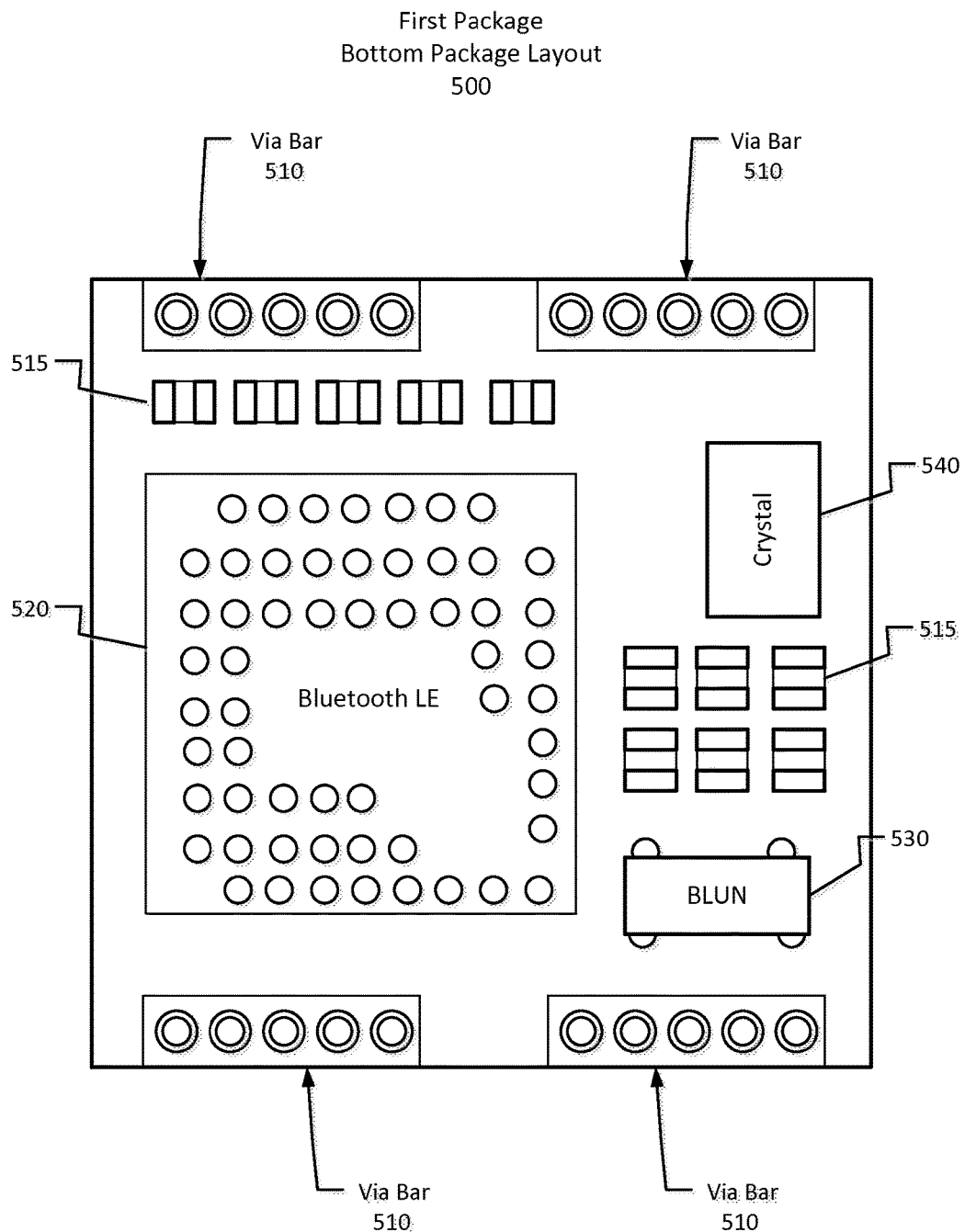
FIG. 5 is an illustration of a layout of a bottom package of a three-dimensional stacked system in package according to an embodiment.

FIG. 5 is an illustration of a layout of a bottom package of a three-dimensional stacked system in package according to an embodiment. In some embodiments, the bottom package 500 (also referred to as the first package) illustrated in FIG. 5 is coupled with the top package 600 illustrated in FIG. 6. In some embodiments, the bottom package includes multiple embedded electronic components, wherein the components may include one or more packaged components, one or more active components or integrated circuits, and one or more passive components.

In this example, via bars 510 are designed to have a height that is equal to the height of the mold compound, which in turn is determined by the WLCSP component (U11) in the mold. Each via bar 510 has 5 vias each, thus enabling 20 interconnections between the bottom package 500 and the top package 600.

A set of RF circuit dies (which may be referred to as RFICs), BLE (Bluetooth Low Energy) 520 and BLUN 530 (also referred to as a balun, a device to convert between a balanced signal and an unbalanced signal), are placed as close as possible to realize the shortest interconnect distance to maximize the power output. The bottom package may further include components such as a crystal oscillator 540.

In some embodiments, an SoC die (not shown in FIG. 5) is attached to the bottom of the first package 500 in an opossum die (or hanging die) fashion, such as illustrated in FIG. 2. This unique configuration enables a shortest interconnection between the silicon SoC and the passive and the active components embedded in the mold just above it. In some embodiments, the RFICs BLE 520 and BLUN 530 are placed very near to each other and connected through a matched differential pair to maximize performance. In some embodiments, 2 via bars are each placed on a first portion (such as a north side) of the package and 2 via bars are placed on a second portion (such as an opposite south side) of the package to facilitate the connection to the top package. In some embodiments, the passive components are placed at optimal locations in the package to reduce the interconnect distance.

Figure 6:
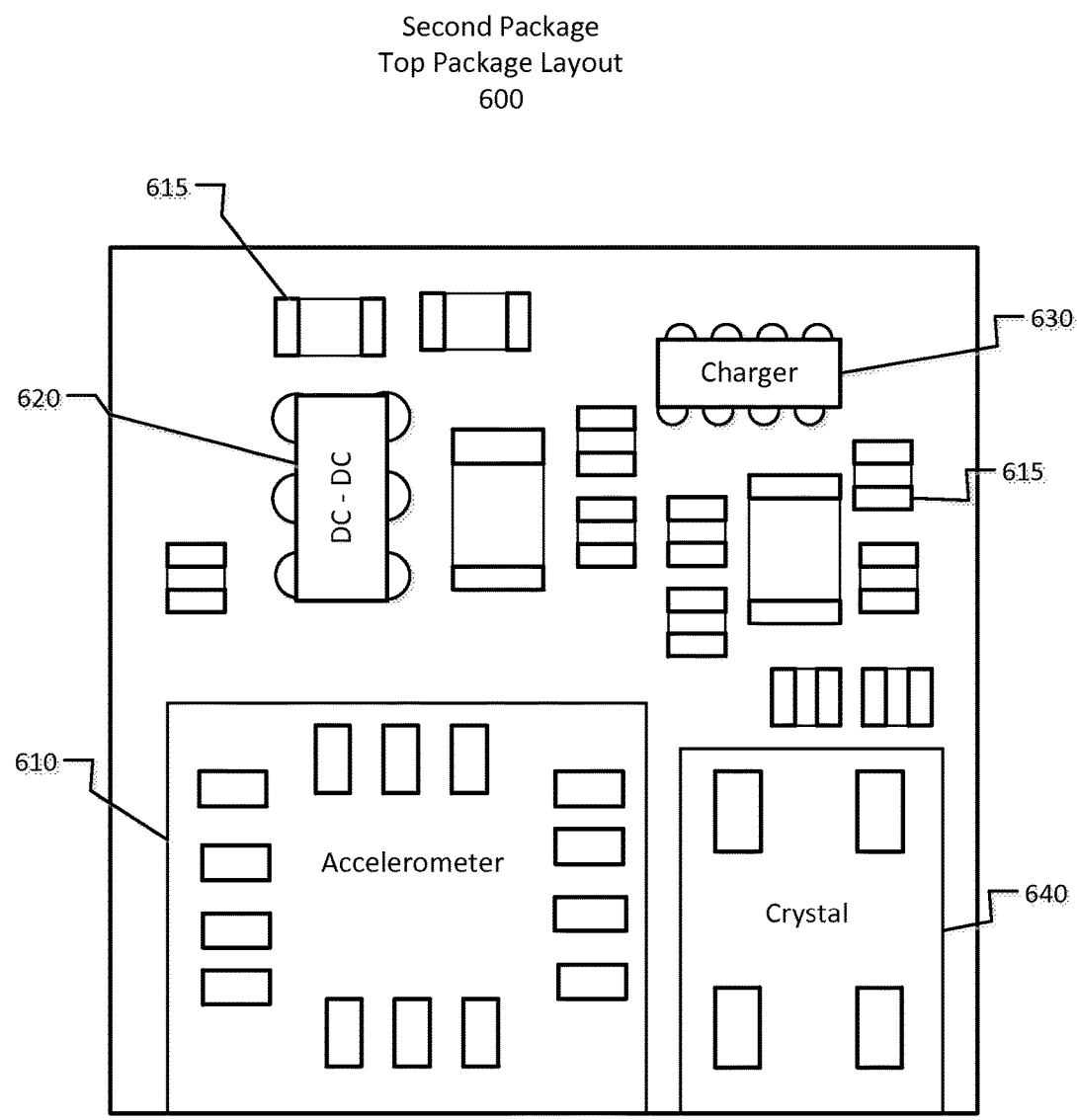
FIG. 6 is an illustration of a layout of a top package of a three-dimensional stacked system in package according to an embodiment.

In some embodiments, interconnections between components are accomplished by one or more interconnect metal layers (which may be approximately 10-20 um thick each) and one or more dielectric layers (approximately 10-20 um thick each) on one or more surfaces of the packages. BGAs (not illustrated in FIG. 5) are assembled on the periphery of are first package to attach onto the motherboard. The height and pitch of the BGAs are selected such that enough clearance for the opossum die and also to allow routing of metal layers. The dimensions of the fabricated top package 500 in this particular example may be 5.5 mm×6 mm×0.9 mm FIG. 6 is an illustration of a layout of a top package of a three-dimensional stacked system in package according to an embodiment. In some embodiments, the top package 600 includes multiple embedded electronic components, wherein the components may include one or more packaged components, one or more active components or integrated circuits, and one or more passive components. In this example, the top package 600 consists of three integrated circuits and fourteen passives (inductors, capacitors, resistors, and crystal) of varying dimensions. For example, a hermetically sealed accelerometer package 610 is embedded in the molding compound. The accelerometer 610, being the tallest component (height of ~0.8 mm in a z-direction), dictates an overall height of the top package 600. In this particular example, a molding compound of 900 um thick may be deposited to provide a 100 um overmold on top of the accelerometer 610. Further, a DC-DC converter 620 and a battery Charger 630, both in bare die formats, are embedded and interconnected to achieve a smallest form factor along with a crystal 640, one inductor, 4 resistors and 10 capacitors in the package. In this example, the dimensions of the fabricated top package may be 5.5 mm×6.0 mm×0.9 mm. In some embodiments, BGA balls (which may approximately 100 um diameter) are attached to the bottom of the top package 600 to attach it to the via bars and WLCSP components in the bottom package 500, as illustrated in FIG. 5.

FIGS. 5 and 6 illustrate a particular example of a 3D stacked System in Package (3D SiP) including 6 integrated circuits, and 26 passive components of varying dimensions, the resulting system being suitable for wearable electronic and health monitoring devices. These types of devices require integration of large number of disparate components in a small form factor. Such a SiP may be used in wristwatches, wristbands, rings and wearable health monitoring and fitness tracking systems. However, embodiments are not limited to this particular this type of architecture and method of fabrication, but rather can be applied for other small form factor systems.

Figure 7:
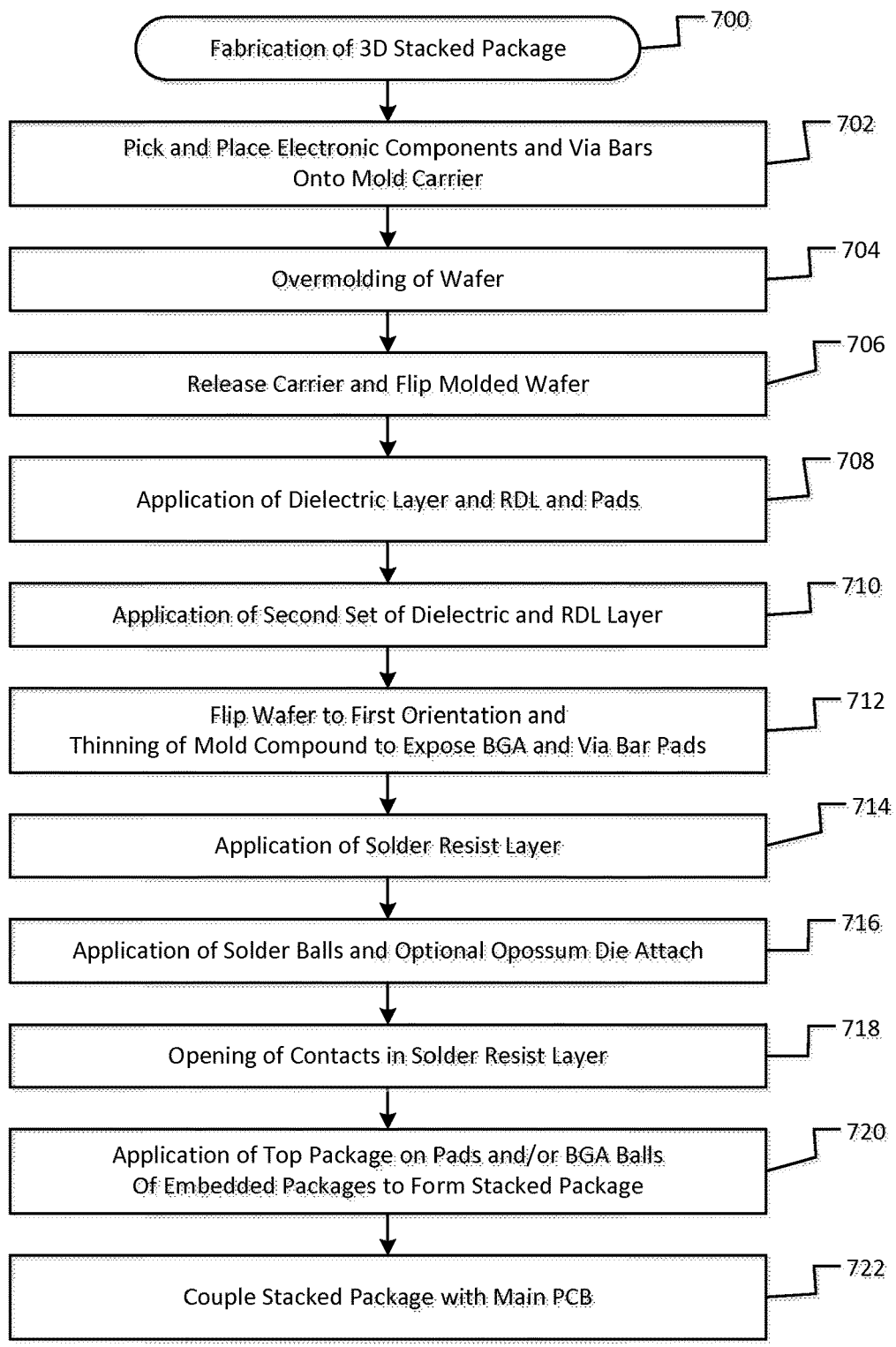
FIG. 7 is a flow chart to illustrate fabrication of a three-dimensional stacked system in package according to an embodiment.

FIG. 7 is a flow chart to illustrate fabrication of a three-dimensional stacked system in package according to an embodiment. FIGS. 8A through 8M are illustrations of fabrication processes for a three-dimensional stacked system in package according to an embodiment. However, embodiments are not limited to the particular processes illustrated in FIG. 7 and FIGS. 8A through 8M. As illustrated in FIGS. 8A through 8M, a bottom package may also be designated as Pkg1 and a top package may also be designated as Pkg2.

Figure 8A:
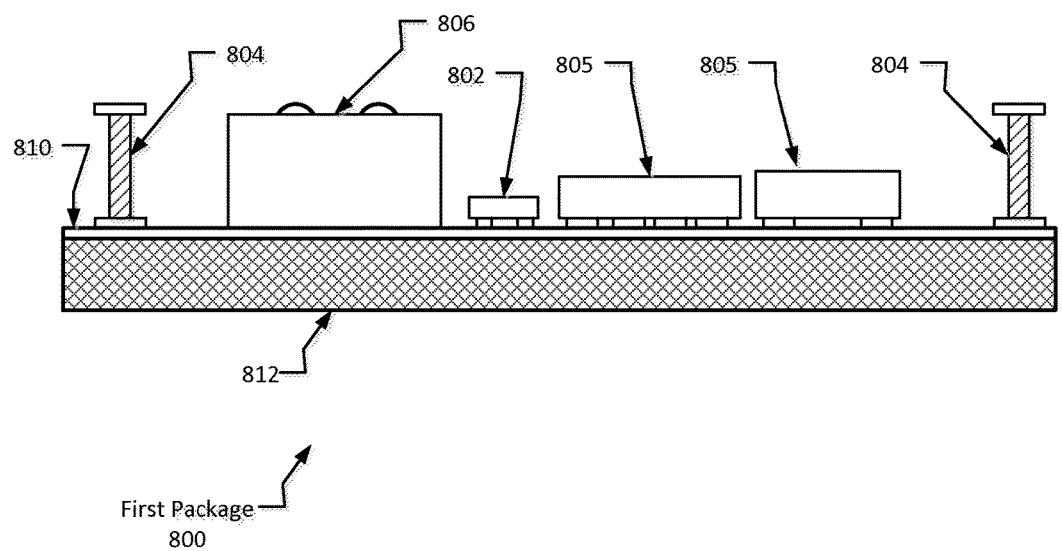
FIGS. 8A through 8M are illustrations of fabrication processes for a three-dimensional stacked system in package according to an embodiment.

In some embodiments, a process for fabrication of a 3D stacked package 700 includes, but is not limited to, the following:

702: Pick and place electronic components, including one or more packaged components 806, active or integrated circuit components 805, or passive components 802, and one or more via bars 804 (e.g., using BGA solder balls) onto a mold carrier 812, which may be held in place by adhesive tape 810 or other means, to form wafer for a first/bottom package 800. (FIG. 8A)

Figure 8B:
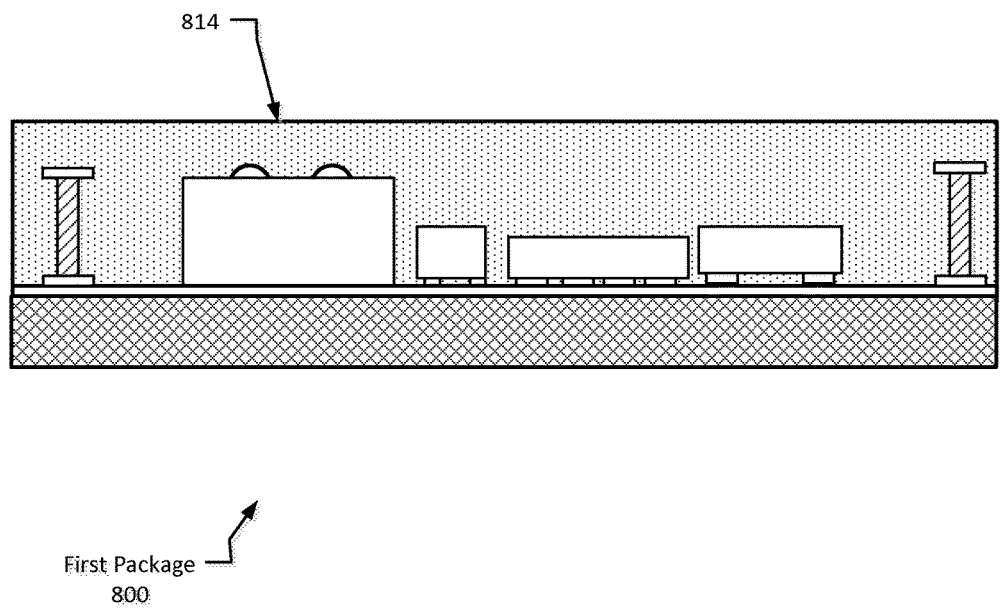

704: Overmolding 814 of the wafer (for example, utilizing an epoxy mold compound) to embed the electronic components and via bars for the first package 800. (FIG. 8B)

Figure 8C:
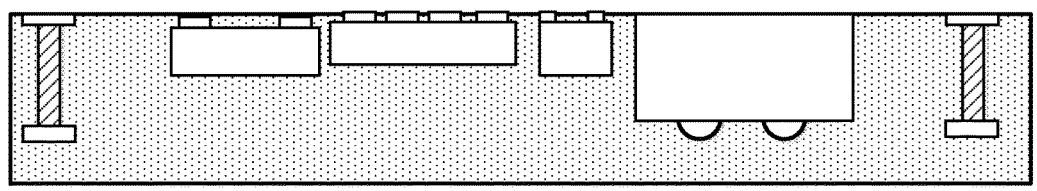

706: Release of the mold carrier and flipping of the molded wafer for the first package 800. (FIG. 8C)

Figure 8D:
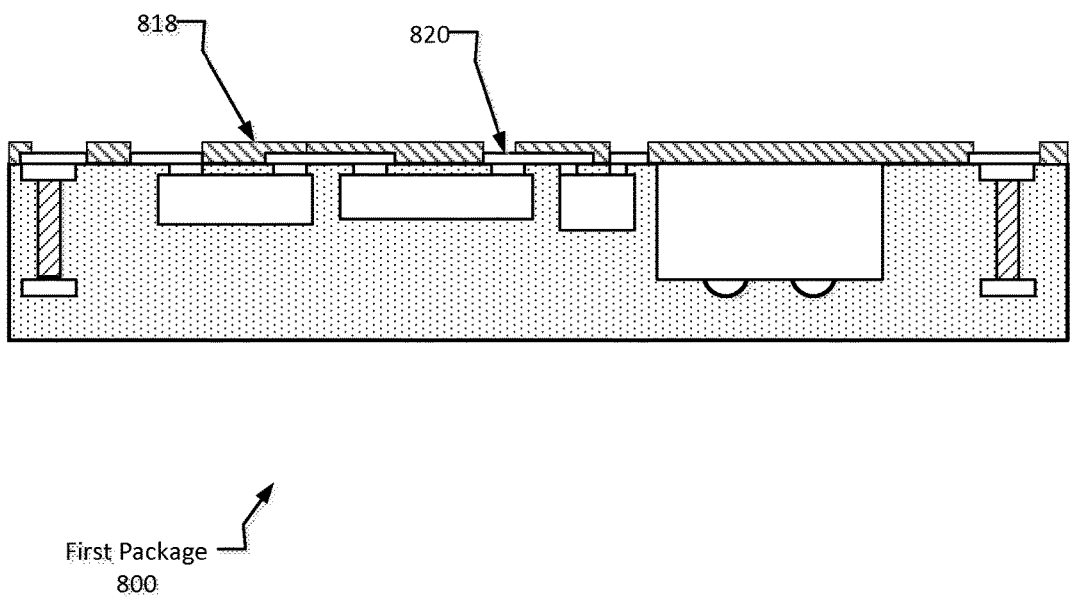

708: Application of a dielectric die layer (optional for the fabrication process); and application and structuring of a first redistribution layer (RDL) and pads 820. (FIG. 8D)

Figure 8E:
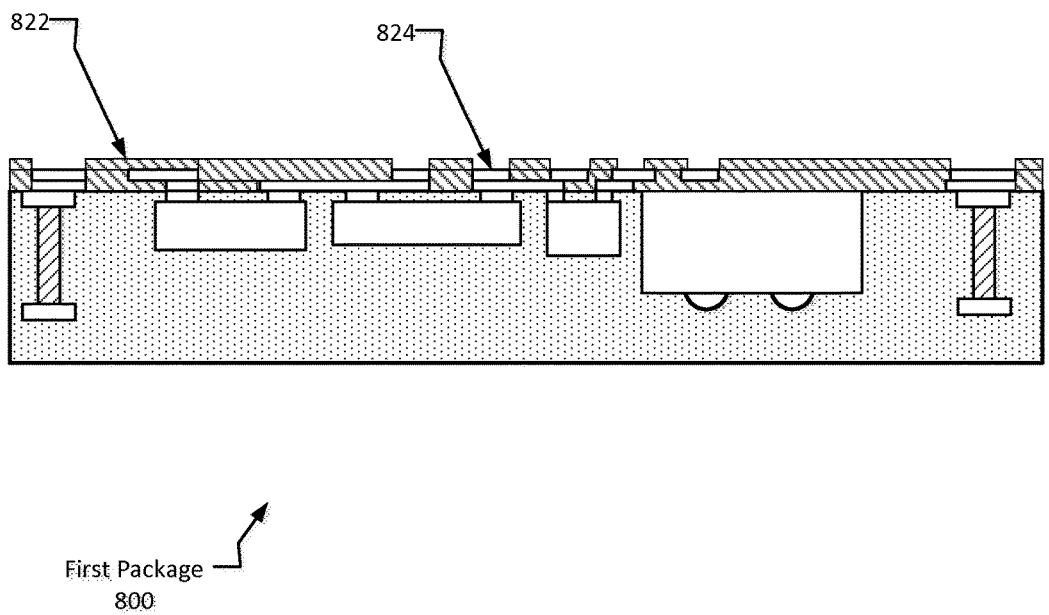

710: Optional application of a second set of dielectric layer 822 and RDL layer 824. (FIG. 8E)

Figure 8F:
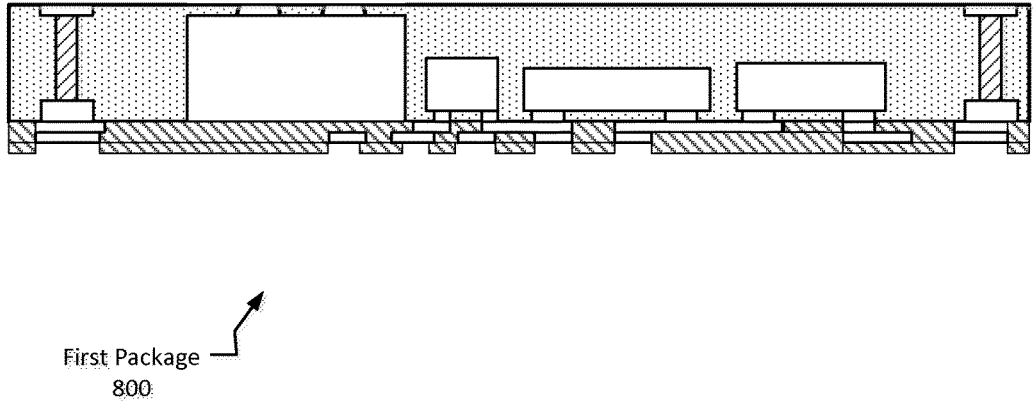
Figure 8G:
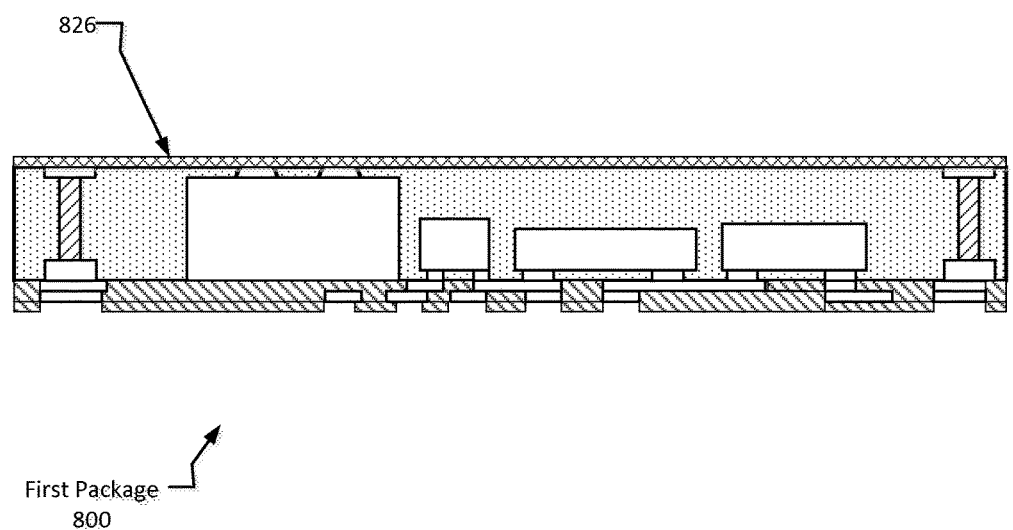

712: Flipping the wafer back to the first orientation and thinning of the mold compound of the first package to expose the BGA solder balls of the pre-packaged components and via bar pads. (FIG. 8F)

714: Application of solder resist layer 826 to the top side of the wafer of the first package 800. (FIG. 8G) Fabrication may further include application of dielectric(s) and RDL layer(s) 826 to the top side of the wafer, which is not illustrated here.

Figure 8H:
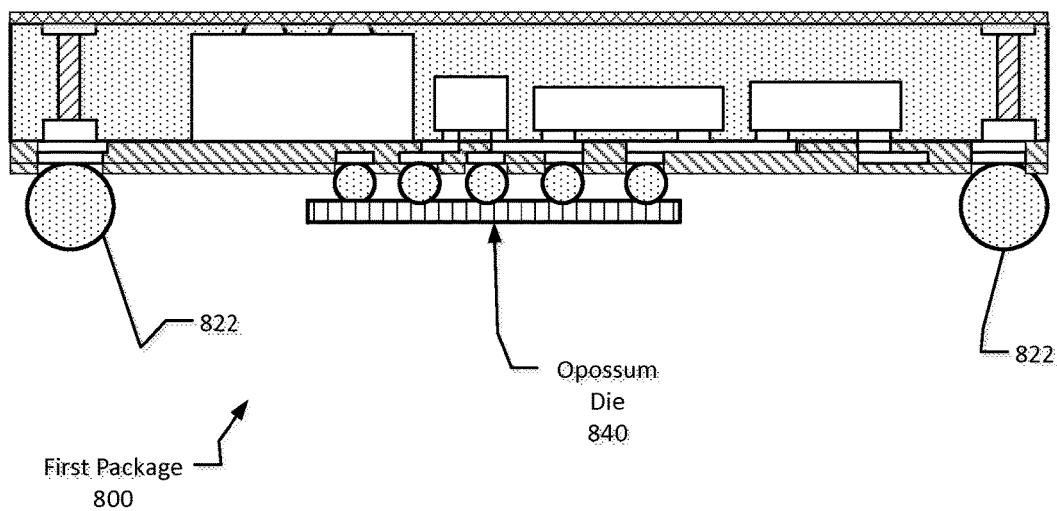

716: Application of solder balls 822 and optional attachment of a hanging/opossum die 840 on a bottom side of the first package 800, which is illustrated as being coupled by solder ball attachment. (FIG. 8H)

Figure 8I:
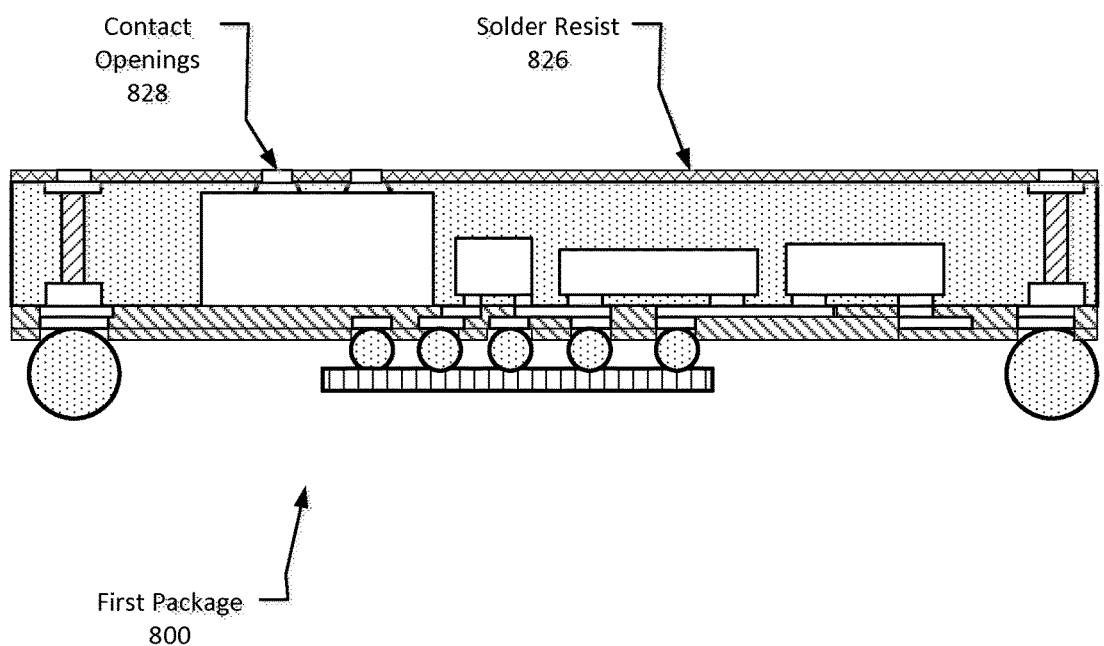

718: Opening of contacts, shown as contact openings 828 in the solder resist layer 826. (FIG. 8I)

Figure 8J:
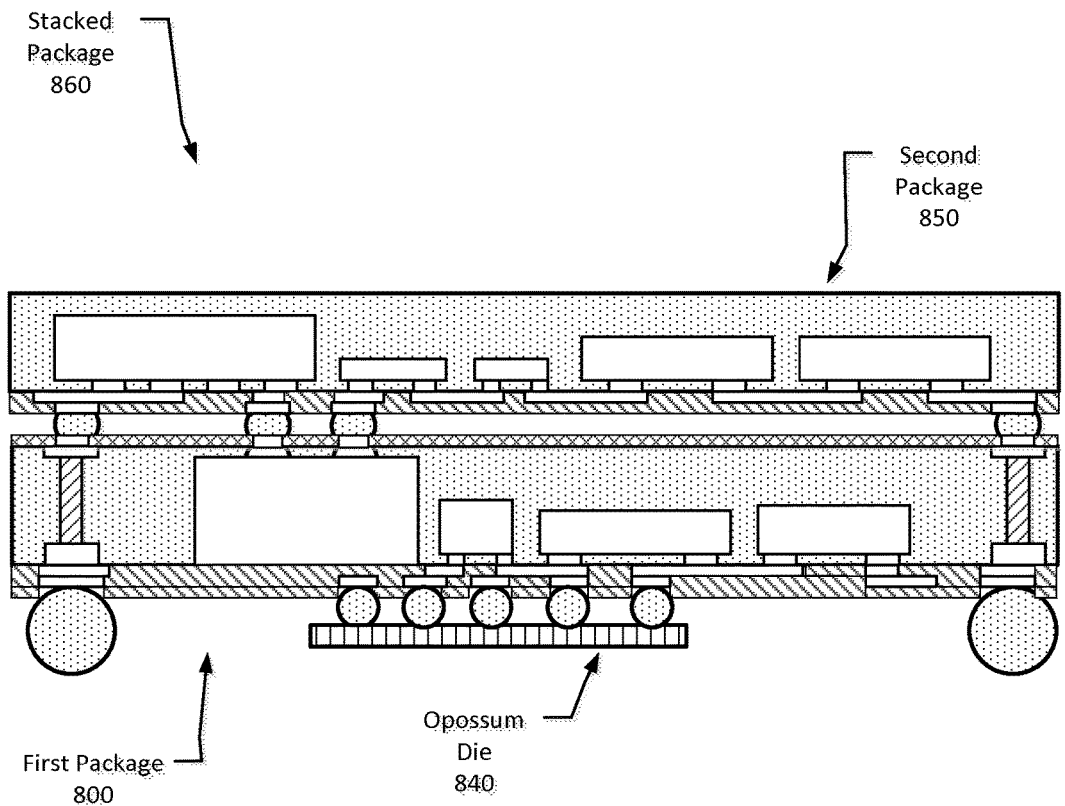

720: Application of a second/top package 850 on the pads and/or on BGA balls of the embedded packages of the bottom package 800 to form the stacked package 860. (FIG. 8J)

Figure 8K:
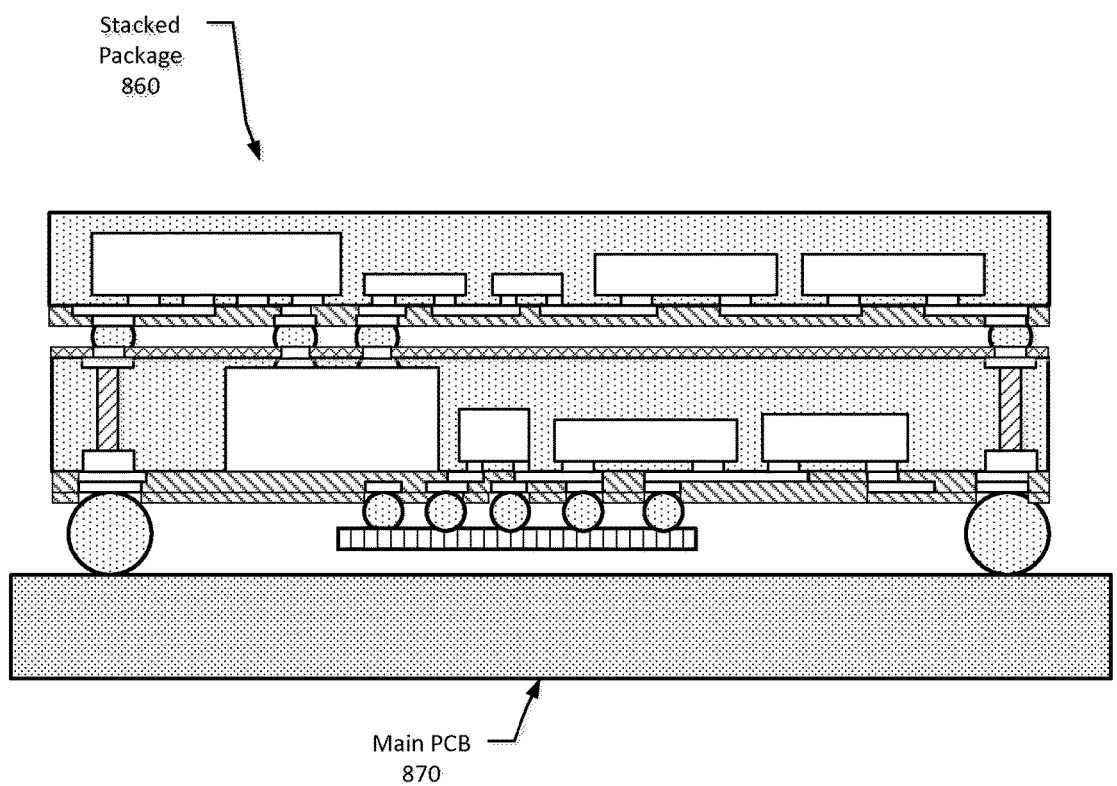
Figure 8L:
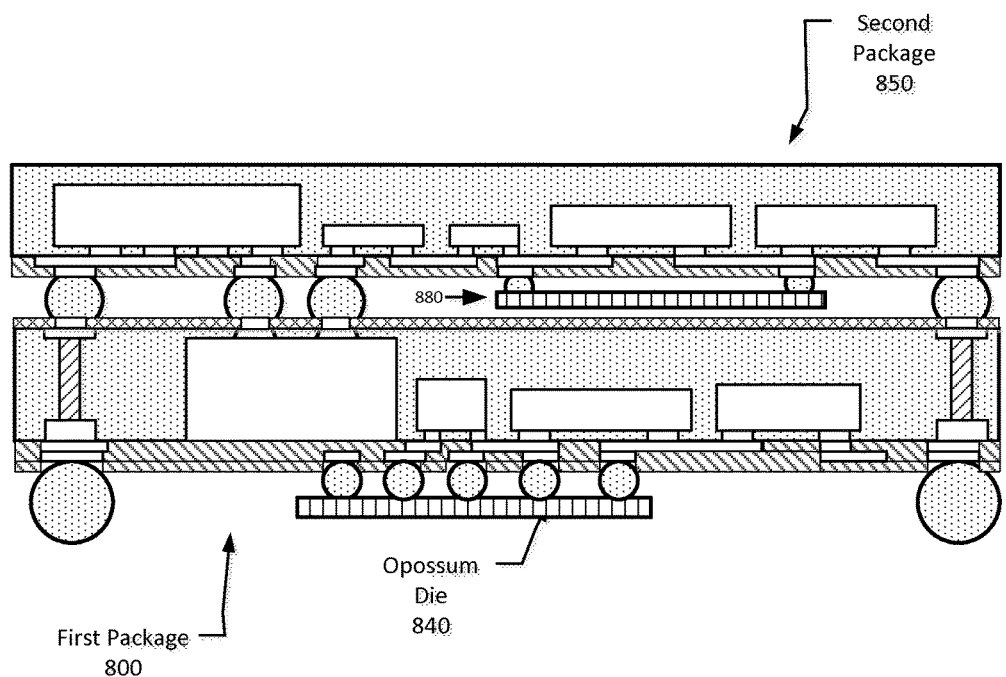
Figure 8M:
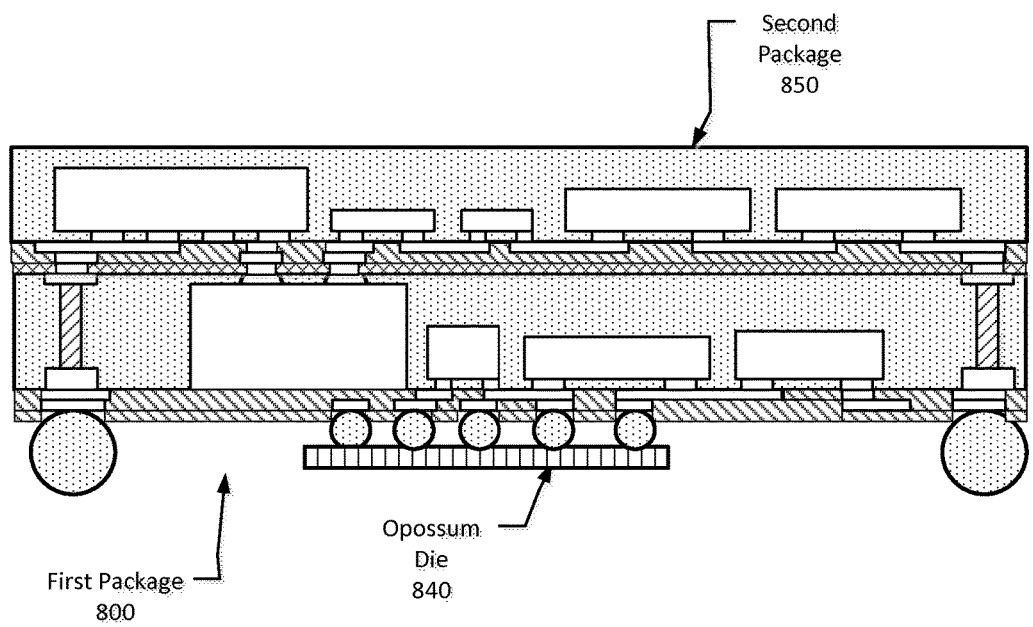

722: Coupling of the stacked package to a main PCB (printed circuit board, also referred to as the motherboard 870. The connection provides for interconnection of pre-packaged components through the top package to the via bars into the main PCB 870. (FIG. 8K)

Also illustrated are the following alternative embodiments:

Coupling of an additional hanging/opossum die 880 to a bottom side of the second package 850, in addition to the hanging die 840 coupled to the bottom side of the first package 800, thereby providing a stacked package with multiple hanging dies between the package layers. (FIG. 8L) Further, embodiments are not limited to the illustrated packages. In some embodiments, the second package 850 may further include via bars, and an additional third package (not illustrated here) may be coupled with the second package in a same or similar manner as the coupling of the first and second packages. Further, an optional third hanging die may be coupled with a bottom side of the third package.

Assembly of the top package 850 and the bottom package 800 with an alternative thermal compression bonding. (FIG. 8M) In some embodiments, such assembly may be implemented alternatively to the coupling using solder ball attachment illustrated in FIG. 8J.

Figure 9:
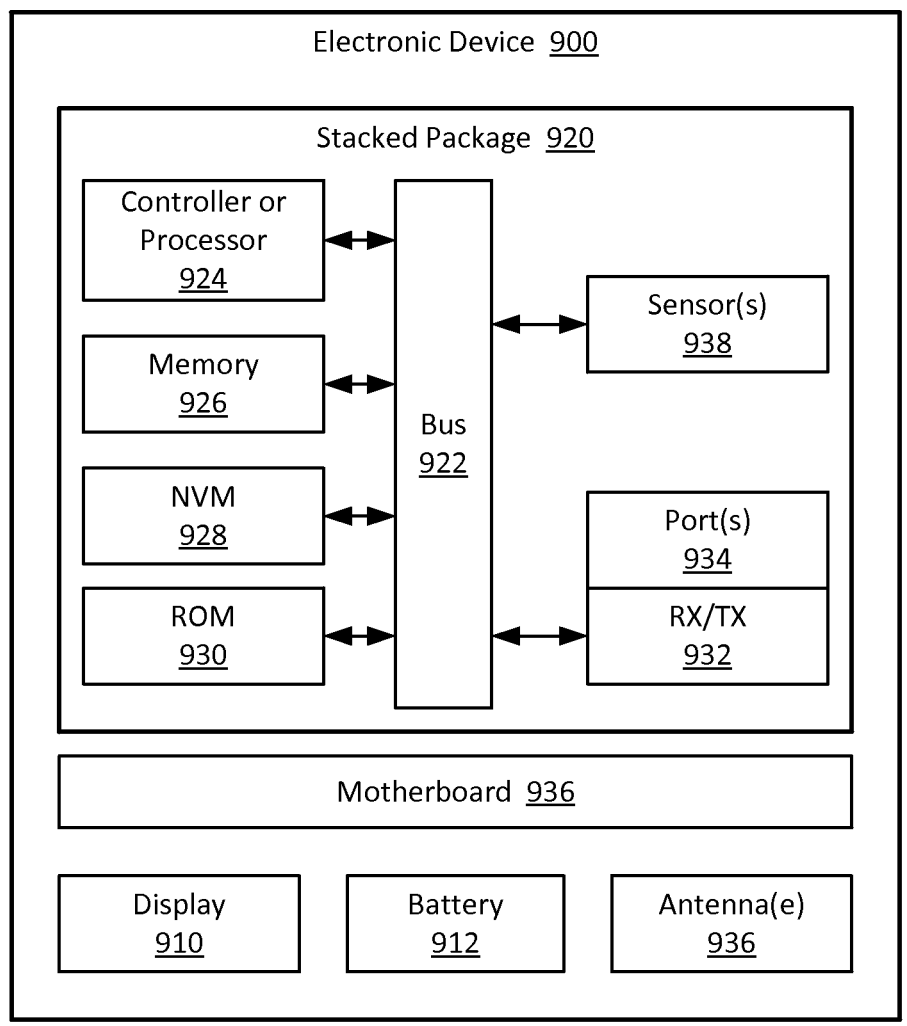
FIG. 9 is an illustration of components of an electronic device including a three-dimensional stacked system in package according to an embodiment.

FIG. 9 is an illustration of components of an electronic device including a three-dimensional stacked system in package according to an embodiment. In some embodiments, an electronic device 900 includes a stacked package 920, coupled with a motherboard 936.

In some embodiments, the stacked package 920 may include one or more controllers, control logic, or processors (referred in general as a controller) 924 coupled to one or more buses or interconnects, shown in general as bus 922. In some embodiments, the controller 924 may include one or more general-purpose processors or special-processor processors.

In some embodiments, the bus 922 is a communication means for transmission of data. The bus 922 is illustrated as a single bus for simplicity, but may represent multiple different interconnects (including an RDL and via) or buses and the component connections to such interconnects or buses may vary. The bus 922 shown in FIG. 9 is an abstraction that represents any one or more separate physical buses, point-to-point connections, or both connected by appropriate bridges, adapters, or controllers.

In some embodiments, the stacked package 920 further comprises a memory 926 for storing information and instructions to be executed by the controller 924. Memory 926 may include, but is not limited to, dynamic random access memory (DRAM).

The stacked package 920 also may comprise a non-volatile memory (NVM) 928; and a read only memory (ROM) 930 or other static storage device for storing static information and instructions.

In some embodiments, the stacked package 920 includes one or more transmitters or receivers 932 coupled to the bus 922 for wireless communication. In some embodiments, the stacked package 920 may include one or more ports 934 for the transmission and reception of data via wired communications. Wireless communication includes, but is not limited to, Wi-Fi, Bluetooth™, near field communication, and other wireless communication standards.

In some embodiments, the stacked package may include one or more sensors 938 to sense environmental factors, wherein the one or more sensors may include an accelerometer, a temperature sensor, a voltage sensor, or other sensor.

In some embodiments, the electronic device may include other components such as, for example, a display 910, such as a liquid crystal display (LCD), one or more antennae 936, such as dipole or monopole antennae, for the transmission and reception of data via wireless communication, and a power source such as a battery 912 to power the electronic device 900. The power source may further include a solar cell, a fuel cell, a charged capacitor, near field inductive coupling, or other system or device for providing or generating power. The power provided by the power source may be distributed as required to elements of the electronic device 900.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, an apparatus includes a first package having a first side and an opposite second side, the first package including a plurality of embedded electronic components and one or more embedded via bars, each via bar including a plurality of through vias; and a second package having a first side and an opposite second side, the second package including a plurality of embedded electronic components, wherein a first side of the first package and a second side of second package are coupled together by a plurality of connections, including at least a first connection connecting the second package to a first component of the first package and a second connection connecting the second package to a first via bar of the one or more via bars.

In some embodiments, the plurality of embedded electronic components for each of the first package and the second package includes one or more of any of the following: packaged components; active or integrated circuit components; or passive components In some embodiments, the first side of the first package and the second package is a top side, and wherein the second side of the first package and the second package is a bottom side.

In some embodiments, the apparatus further includes a hanging die coupled with the second side of the first package.

In some embodiments, the apparatus further includes a ball grid array (BGA) coupled to the second side of the first package, wherein a diameter of each ball of the BGA is greater than a height of the hanging die.

In some embodiments, the first package is coupled with a surface of a motherboard by the BGA.

In some embodiments, a first side of the hanging die is coupled with the second side of the first package, and wherein there is a gap between a second side of the hanging die, the second side of the hanging die being opposite to the first side of the hanging die, such that the hanging die is not in contact with the surface of the motherboard.

In some embodiments, a height of a first component of the first package is the same as a height of the one or more via bars.

In some embodiments, the first package includes two or more radio frequency (RF) components, the RF components being adjacent to each other in the first package.

In some embodiments, the apparatus comprises a three-dimensional system in package (SiP).

In some embodiments, an electronic device includes: a stacked system in package (SiP), the stacked system in package including a first package including a plurality of embedded electronic components and one or more embedded via bars, each via bar including a plurality of through vias, the first package having a first side and an opposite second side, a second package including a plurality of embedded electronic components, the second package having a first side and an opposite second side, and a main printed circuit board (PCB), the first package being coupled with the main PCB. The stacked system in package includes a receiver, a transmitter, or both, and wherein the electronic device includes one or more antennas including a dipole antenna for the transmission of data. In some embodiments, wherein a first side of the first package and a second side of second package are coupled together by a plurality of connections, including at least a first connection connecting the second package to a first component of the first package and a second connection connecting the second package to a first via bar of the one or more via bars.

In some embodiments, the plurality of embedded electronic components for each of the first package and the second package includes one or more of any of the following: packaged components; active or integrated circuit components; or passive components.

In some embodiments, the electronic device further includes a hanging die coupled with the second side of the first package.

In some embodiments, the electronic device further includes a ball grid array (BGA) coupled to the second side of the first package, wherein a diameter of each ball of the BGA is greater than a height of the hanging die, and wherein the first package is coupled with the main PCB by the BGA.

In some embodiments, a height of a first component of the first package is the same as a height of the one or more via bars.

In some embodiments, the electronic device is a mobile electronic device. In some embodiments, the electronic device is a wearable electronic device.

In some embodiments, a method includes: placing a plurality of electronic components and one or more via bars on a mold carrier to form a wafer for a first package; overmolding the wafer for the first package to embed the electronic components and via bars using a mold compound; releasing the mold carrier for the first package; thinning the mold compound of the wafer of the first package to expose connections of the via bars and a first electronic component on a top side of the first package; and applying a second package on the connections of the first electronic component and the via bars of the first package to form a stacked package.

In some embodiments, placing the plurality of electronic components includes placing one or more of any of the following: packaged components; active or integrated circuit components; or passive components.

In some embodiments, a height of the first component of the first package is the same as a height of the one or more via bars of the first package.

In some embodiments, the method further includes applying a dielectric die layer and redistribution layer (RDL) on the bottom side of the first package.

In some embodiments, the method further includes optionally applying a dielectric layer and RDL layer on a top side of the first package.

In some embodiments, the method further includes coupling the first package with a motherboard.

In some embodiments, the method further includes coupling a hanging die with the bottom side of the first package.

In some embodiments, coupling the hanging die with the bottom side of the first package includes maintaining a gap between the hanging die and the motherboard such that the hanging die is not in contact with a surface of the motherboard.

In some embodiments, a system in package is produced by a process including placing a plurality of electronic components and one or more via bars on a mold carrier to form a wafer for a first package; overmolding the wafer for the first package to embed the electronic components and via bars using a mold compound; releasing the mold carrier for the first package; thinning the mold compound of the wafer of the first package to expose connections of the via bars and a first electronic component on a top side of the first package; and applying a second package on the connections of the first electronic component and the via bars of the first package to form a stacked package.

In some embodiments, a height of the first component of the first package is the same as a height of the one or more via bars of the first package.

In some embodiments, the process further includes applying a dielectric die layer and redistribution layer (RDL) on the bottom side of the first package.

In some embodiments, the process further includes applying a dielectric layer and RDL layer on a top side of the first package.

In some embodiments, the process further includes coupling the first package with a motherboard.

In some embodiments, the process further includes coupling a hanging die with the bottom side of the first package. In some embodiments, coupling the hanging die with the bottom side of the first package includes maintaining a gap between the hanging die and the motherboard such that the hanging die is not in contact with a surface of the motherboard.

What is claimed is:

1. An apparatus comprising:
   a first package having a first side and an opposite second side, the first package including:
      a plurality of embedded electronic components, ones of the plurality of embedded electronic components laterally adjacent to one another, and
      one or more embedded via bars, each via bar including a plurality of through vias;
   and
   a second package having a first side and an opposite second side, the second package including:
      a plurality of embedded electronic components, ones of the plurality of embedded electronic components laterally adjacent to one another;
      wherein a first side of the first package and a second side of second package are coupled together by a plurality of connections, including at least a first connection connecting the second package to a first component of the first package and a second connection connecting one of the plurality of embedded electronic components of the second package to a first via bar of the one or more embedded via bars, wherein the one of the plurality of embedded electronic components of the second package is directly over the first via bar of the one of the one or more embedded via bars of the first package.

2. The apparatus of claim 1, wherein the plurality of embedded electronic components for each of the first package and the second package includes one or more of any of the following:
   packaged components;
   active or integrated circuit components; or
   passive components.

3. The apparatus of claim 1, wherein the first side of the first package and the second package is a top side, and wherein the second side of the first package and the second package is a bottom side.

4. The apparatus of claim 1, further comprising a hanging die coupled with the second side of the first package.

5. The apparatus of claim 4, further comprising a ball grid array (BGA) coupled to the second side of the first package, wherein a diameter of each ball of the BGA is greater than a height of the hanging die.

6. The apparatus of claim 5, wherein the first package is coupled with a surface of a motherboard by the BGA.

7. The apparatus of claim 6, wherein a first side of the hanging die is coupled with the second side of the first package, and wherein there is a gap between a second side of the hanging die, the second side of the hanging die being opposite to the first side of the hanging die, such that the hanging die is not in contact with the surface of the motherboard.

8. The apparatus of claim 1, wherein a height of a first component of the first package is the same as a height of the one or more via bars.

9. The apparatus of claim 1, wherein the first package includes two or more embedded radio frequency (RF) components, the RF components being adjacent to each other in the first package.

10. The apparatus of claim 1, wherein the apparatus comprises a three-dimensional system in package (SiP).

11. An electronic device comprising:
a stacked system in package (SiP), the stacked system in package including:
a first package including a plurality of embedded electronic components and one or more via bars, ones of the plurality of embedded electronic components laterally adjacent to one another, each via bar including a plurality of through vias, the first package having a first side and an opposite second side, and
a second package including a plurality of embedded electronic components, ones of the plurality of embedded electronic components laterally adjacent to one another, the second package having a first side and an opposite second side; and
a main printed circuit board (PCB), the first package being coupled with the main PCB;
wherein the stacked system in package includes a receiver, a transmitter, or both, and wherein the electronic device includes one or more antennas including a dipole antenna for the transmission of data; and
wherein a first side of the first package and a second side of second package are coupled together by a plurality of connections, including at least a first connection connecting the second package to a first component of the first package and a second connection connecting one of the plurality of embedded electronic components of the second package to a first via bar of the one or more via bars, wherein the one of the plurality of embedded electronic components of the second package is directly over the first via bar of the one of the one or more embedded via bars of the first package.

12. The electronic device of claim 11, wherein the plurality of embedded electronic components for each of the first package and the second package includes one or more of any of the following:
packaged components;
active or integrated circuit components; or
passive components.

13. The electronic device of claim 11, further comprising a hanging die coupled with the second side of the first package.

14. The electronic device of claim 13, further comprising a ball grid array (BGA) coupled to the second side of the first package, wherein a diameter of each ball of the BGA is greater than a height of the hanging die, and wherein the first package is coupled with the main PCB by the BGA.

15. The electronic device of claim 11, wherein a height of a first component of the first package is the same as a height of the one or more via bars.

16. The electronic device of claim 11, wherein the electronic device is a mobile electronic device.

17. The electronic device of claim 16, wherein the electronic device is a wearable electronic device.

18. A method comprising:
placing a plurality of electronic components and one or more via bars on a mold carrier to form a wafer for a first package, ones of the plurality of embedded electronic components laterally adjacent to one another;
overmolding the wafer for the first package to embed the electronic components and one or more via bars using a mold compound;
releasing the mold carrier for the first package;
thinning the mold compound of the wafer of the first package to expose connections of the via bars and a first electronic component on a top side of the first package; and
applying a second package on the connections of the first electronic component and the via bars of the first package to form a stacked package, the second package comprising a plurality of embedded electronic components, ones of the plurality of embedded electronic components laterally adjacent to one another, wherein one of the plurality of embedded electronic components of the second package is directly over and connected to one of the one or more via bars of the first package.

19. The method of claim 18, wherein placing the plurality of electronic components includes placing one or more of any of the following:
packaged components;
active or integrated circuit components; or
passive components.

20. The method of claim 18, wherein a height of the first component of the first package is the same as a height of the one or more via bars of the first package.

21. The method of claim 18, further comprising applying a dielectric die layer and redistribution layer (RDL) on the bottom side of the first package.

22. The method of claim 21, further comprising optionally applying a dielectric layer and RDL layer on a top side of the first package.

23. The method of claim 18, further comprising coupling the first package with a motherboard.

24. The method of claim 23, further comprising coupling a hanging die with the bottom side of the first package.

25. The method of claim 24, wherein coupling the hanging die with the bottom side of the first package includes maintaining a gap between the hanging die and the motherboard such that the banging die is not in contact with a surface of the motherboard.

* * * * *

UNITED STATES PATENT AND TRADEMARK OFFICE
CERTIFICATE OF CORRECTION

PATENT NO. : 10,483,250 B2  
APPLICATION NO. : 15/765992  
DATED : November 19, 2019  
INVENTOR(S) : Vijay K. Nair et al.

Page 1 of 1

It is certified that error appears in the above-identified patent and that said Letters Patent is hereby corrected as shown below:

In the Claims

Column 12, Claim 1, Line 30, delete the first occurrence of "a" and insert --the--.
Column 12, Claim 1, Line 30, delete the second occurrence of "a" and insert --the--.
Column 12, Claim 1, Line 31, insert --the-- before "second".
Column 13, Claim 11, Line 31, delete the first occurrence of "a" and insert --the--.
Column 13, Claim 11, Line 31, delete the second occurrence of "a" and insert --the--.
Column 13, Claim 11, Line 32, insert --the-- before "second".

Signed and Sealed this
Twenty-fifth Day of February, 2020

Andrei Iancu
*Director of the United States Patent and Trademark Office*